(12) United States Patent
Mao et al.

(10) Patent No.: US 11,069,653 B2
(45) Date of Patent: *Jul. 20, 2021

(54) METHODS AND STRUCTURES FOR PACKAGING SEMICONDUCTOR DIES

(71) Applicant: Taiwan Semiconductor Manufacturing Company, Ltd., Hsinchu (TW)

(72) Inventors: Yi-Chao Mao, Zhongli (TW); Jing-Cheng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

This patent is subject to a terminal disclaimer.

(21) Appl. No.: 15/641,130

(22) Filed: Jul. 3, 2017

(65) Prior Publication Data

US 2017/0301648 A1 Oct. 19, 2017

Related U.S. Application Data

(63) Continuation of application No. 14/165,280, filed on Jan. 27, 2014, now Pat. No. 9,698,121.

(51) Int. Cl.
*H01L 23/00* (2006.01)
*H01L 21/56* (2006.01)
(Continued)

(52) U.S. Cl.
CPC ............ *H01L 24/96* (2013.01); *H01L 21/561* (2013.01); *H01L 21/78* (2013.01); *H01L 24/11* (2013.01); *H01L 24/97* (2013.01); *H01L 21/568* (2013.01); *H01L 23/3128* (2013.01); *H01L 24/13* (2013.01); *H01L 24/83* (2013.01); *H01L 2224/0231* (2013.01); *H01L 2224/04105* (2013.01);
(Continued)

(58) Field of Classification Search
CPC ....... H01L 24/96; H01L 21/561; H01L 21/78; H01L 24/11; H01L 24/97; H01L 24/13; H01L 24/83; H01L 2224/0231
See application file for complete search history.

(56) References Cited

U.S. PATENT DOCUMENTS 3,767,493 A 10/1973 Kump
7,438,030 B1 * 10/2008 Okojie ................ F16K 99/0001
123/90.11

(Continued)

FOREIGN PATENT DOCUMENTS

| TW | I352411 B | 6/2009 |
| TW | 201019423 A | 5/2010 |
| TW | 201205699 A | 2/2012 |

*Primary Examiner* — Mohammad M Choudhry
(74) *Attorney, Agent, or Firm* — Slater Matsil, LLP

(57) ABSTRACT

A method of packaging a semiconductor device, comprising: attaching a plurality of dies to a carrier wafer, wherein each of the dies includes a top surface; forming a molding compound layer over the dies, wherein the top surface of the dies are covered by the molding compound layer; removing a first portion of the molding compound layer; removing a second portion of the molding compound layer such that the top surface of the dies is not covered by the molding compound layer; forming a redistribution layer (RDL) over the top surface of the dies; forming a plurality of solder balls over at least a portion of the RDL; and singulating the dies.

20 Claims, 3 Drawing Sheets

(51) Int. Cl.
*H01L 21/78* (2006.01)
*H01L 23/31* (2006.01)

(52) U.S. Cl.
CPC ............... *H01L 2224/11013* (2013.01); *H01L 2224/12105* (2013.01); *H01L 2224/13024* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/83101* (2013.01); *H01L 2224/83192* (2013.01); *H01L 2924/181* (2013.01)

(56) References Cited

U.S. PATENT DOCUMENTS

| | | | |
|---|---|---|---|
| 7,955,895 B2 | 6/2011 | Yang et al. | |
| 8,361,842 B2 | 1/2013 | Yu et al. | |
| 2003/0134496 A1* | 7/2003 | Lee | H01L 23/3114 438/612 |
| 2006/0292812 A1* | 12/2006 | Jung | H01L 27/0207 438/381 |
| 2007/0254411 A1 | 11/2007 | Uhland et al. | |
| 2009/0096115 A1* | 4/2009 | Huang | H01L 23/3121 257/796 |
| 2009/0159122 A1* | 6/2009 | Shook | H01L 31/048 136/256 |
| 2010/0133704 A1 | 6/2010 | Marimuthu et al. | |
| 2011/0156250 A1* | 6/2011 | Goh | H01L 25/16 257/738 |
| 2012/0028411 A1* | 2/2012 | Yu | H01L 21/561 438/107 |
| 2013/0001776 A1* | 1/2013 | Yu | H01L 21/561 257/738 |
| 2013/0292845 A1* | 11/2013 | Choi | H01L 24/94 257/774 |
| 2015/0179544 A1 | 6/2015 | Chockanathan et al. | |

* cited by examiner

METHODS AND STRUCTURES FOR PACKAGING SEMICONDUCTOR DIES

PRIORITY CLAIM AND CROSS-REFERENCE

This patent application is a continuation of U.S. application Ser. No. 14/165,280, filed on Jan. 27, 2014, which application is hereby incorporated by reference herein in its entirety

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Thus, packages such as wafer level packaging (WLP) have begun to be developed, in which integrated circuits (ICs) are placed on a carrier having wiring for making connection to the ICs and other electrical components. In the WLP process, grinding may be used. In the formation of fan-out chip scale packages, device wafers may be sawed, and the known-good-dies are selected and attached onto a carrier, with the known-good-dies spaced apart from each other. The known-good-dies include copper posts for the formation of fan-out connections. A molding compound is then filled into the space between and over the known-good-dies to form a fan-out wafer. After the curing of the molding compound, a grinding process may be performed to remove the portions of the molding compound and other dielectric materials over the copper posts. After the copper posts are exposed, electrical connections may be made to connect to the copper posts, so that the connections to the fan-out wafer are extended into an area larger than the area of the known-good-dies.

Since the layers that are subject to the grinding are often thin layers, accurately stopping the grinding process at the right time is vital to the yield of the integrated manufacturing process. For example, in the manufacturing of the fan-out wafer, the grinding needs to be stopped when the copper posts in substantially all known-good-dies throughout the fan-out wafer are fully exposed, and substantially no over-grinding occur. In the existing grinding technology, a gauge is used to detect the total thickness of the fan-out wafer during the grinding process. When the total thickness is reduced to a pre-determined value, it is assumed that the copper posts are fully exposed. This detection method, however, is inaccurate, and may result in yield loss.

Thus, an improved grinding process is needed to increase the yield of the packaging process.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
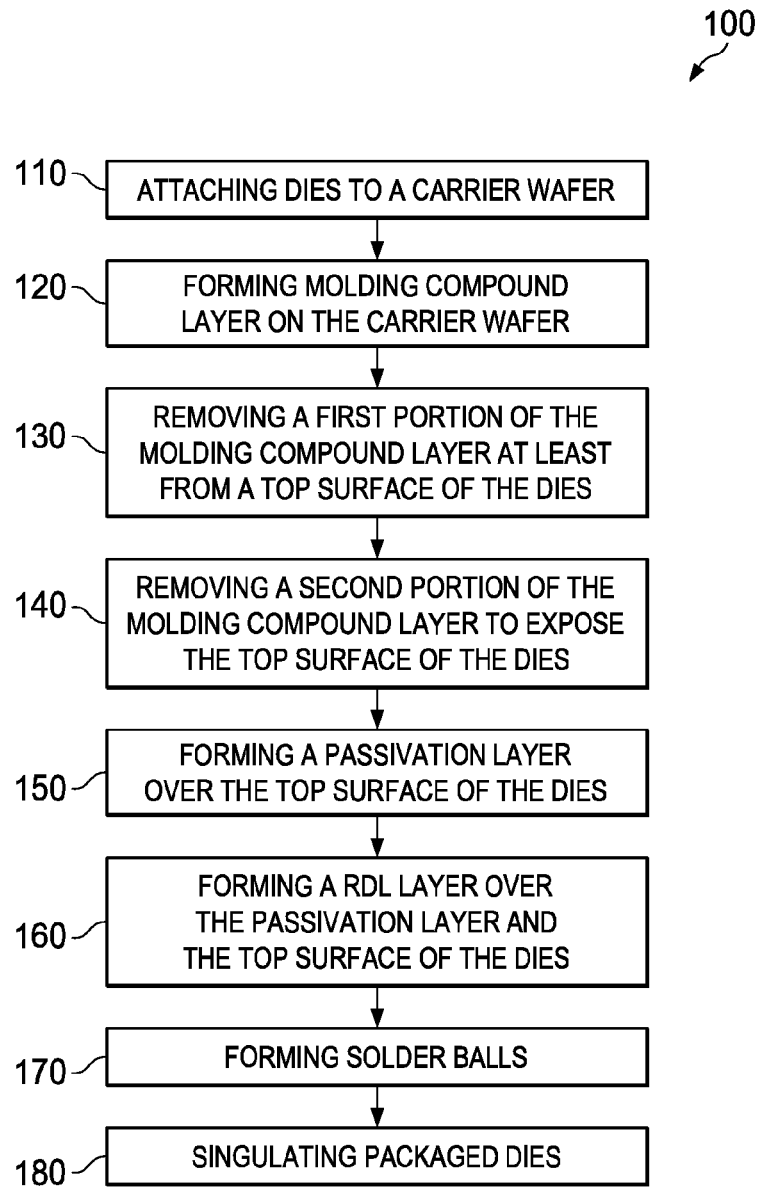
FIG. 1 shows a flow chart of a method for packaging semiconductor dies according to embodiments of the present disclosure.

FIG. 1 illustrates a flow chart of a method 100 for packaging semiconductor dies according to embodiments of the present disclosure. Method 100 begins with a step 110 in which semiconductor dies are attached to a carrier wafer. Method 100 continues with a step 120 in which a molding compound layer is formed on the carrier wafer. Method 100 continues with a step 130 in which a first portion of molding compound layer is removed at least from a top surface of semiconductor dies. Method 100 continues with a step 140 in which a second portion of molding compound layer is removed such that the top surface of each semiconductor die is exposed. Method 100 continues with a step 150 in which a passivation layer is formed over the molding compound layer and the top surface of each semiconductor die. Method 100 continues with a step 160 in which a RDL layer is formed over the passivation layer and the top surface of each semiconductor die. Method 100 continues with a step 170 in which solder balls are formed. Method 100 continues with a step 180 in which each packaged semiconductor die is singulated.

FIGS. 2 through 10 show cross-sectional views of a method of packaging semiconductor dies in a FO-WLP in accordance with embodiments of the present disclosure.

Figure 2:
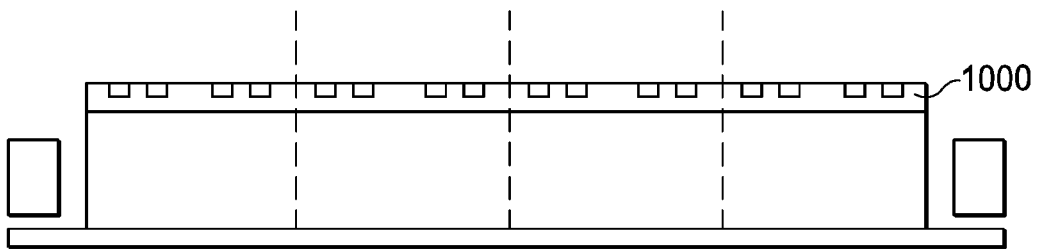
FIGS. 2 through 10 illustrate cross-sectional views of a method of packaging semiconductor dies in a FO-WLP at various stages in accordance with embodiments of the present disclosure.

Referring back to FIG. 1, in step 110, multiple semiconductor dies are attached to a carrier wafer via die attach film (DAF) in embodiments of the present disclosure. As shown in FIG. 2, several dozens or even hundreds of dies 1000 may have been manufactured and/or packaged on a substrate and then separated from the same substrate. In embodiments of the present disclosure, dies 1000 may comprise semiconductor devices or integrated circuits. Dies 1000 may comprise one or more layers of electrical circuitry and/or electronic functions formed thereon, and may include conductive lines, vias, capacitors, diodes, transistors, resistors, inductors, and/or other electrical components (not shown) in embodiments of the present disclosure.

Figure 3:
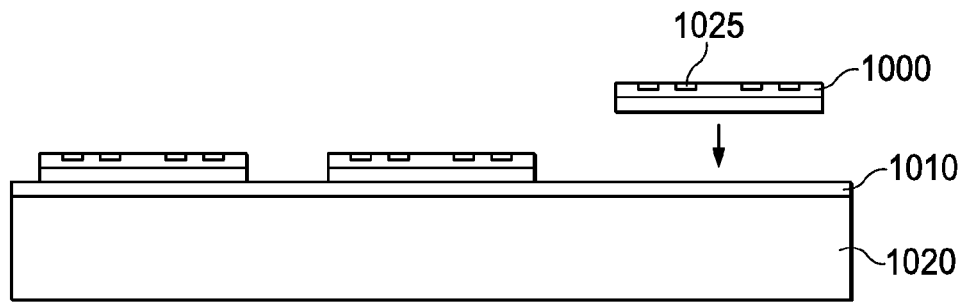

Referring to FIG. 3, a plurality of dies 1000 are attached to a carrier wafer 1020 via a DAF film 1010. The number of dies 1000 attached to carrier wafer 1020 may depend on the size of dies 1000, the size of carrier wafer 1020, and the particular application(s) of each dies 1000 as disclosed in embodiments of the present disclosure. In embodiments of the present disclosure, carrier wafer 1020 may be made with Silicon (Si), Germanium (Ge), glass, III-V compound or other materials. Each die 1000 may have a front side and a back side for purposes of the discussion herein. A pick and place apparatus and method may be used to place each die 1000 in a predetermined location on carrier wafer 1020, as shown in FIG. 3. Back side of dies 1000 are attached to DAF film 1010, as shown in FIG. 3.

In embodiments of the present disclosure, the top surface of each die 1000 may function as an active surface coupling active and passive devices, conductive layers, and dielectric layers according to the electrical design of each die 1000, as illustrated in FIG. 3. In embodiments of the present disclosure, a conductive layer is formed as a contact pad 1025 on the top surface of each die 1000 using a patterning and deposition process. Dies 1000 may have a plurality of contact pads 1025. Contact pads 1025 may be made with aluminum (Al), copper (Cu), tin (Sn), nickel (Ni), gold (Au), silver (Ag), or other electrically conductive material. The deposition of contact pads 1025 may use an electrolytic plating or electroless plating process. The size, shape, and location of contact pads 1025 illustrated in FIG. 3 are only for illustration purposes and are not limiting. The plurality of contact pads 1025 of each die 1000 may be of the same size or of different sizes.

It should be noted that in a conventional WLP packaging process, the top surface of each semiconductor die may be covered with a carrier tape to protect the top surface of the semiconductor dies. However, in embodiments of the present disclosure, the top surface of each die 1000 may not be covered with such carrier tape.

Figure 4:
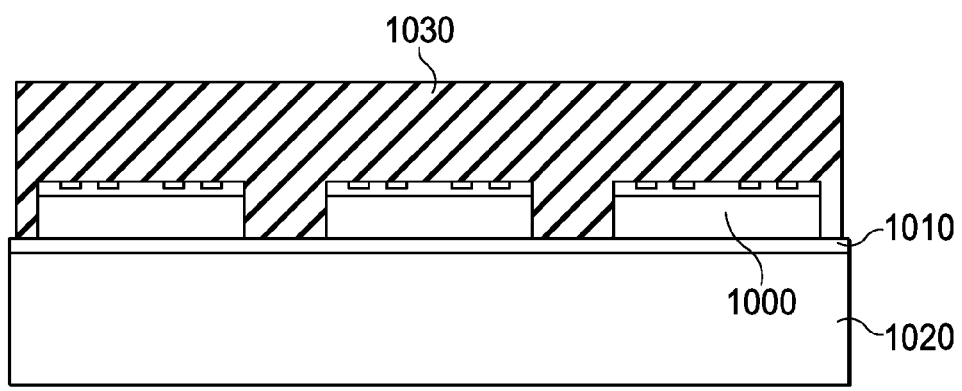

Referring back to FIG. 1, in step 120, multiple dies 1000 may be overmolded with a molding compound layer 1030 using a compression molding process, as shown in FIG. 4. Molding compound layer 1030 may be used for encapsulating dies 1000 by covering dies 1000 and filling the gaps between dies 1000, as shown in FIG. 4. In embodiments of the present disclosure, molding compound layer 1030 may be made with epoxy resin or other encapsulating materials.

Figure 5:
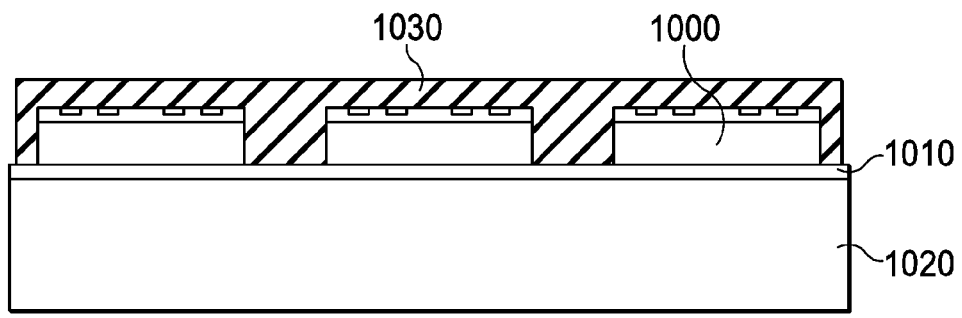

Referring back to FIG. 1, in step 130, a first portion of molding compound layer 1030 is removed at least from the top surface of dies 1000, as shown in FIG. 5. In embodiments of the present disclosure, a grinding process may be performed to remove a portion of molding compound layer 1030 such that the remaining molding compound layer 1030 still covers the top surface of each die 1000 and the gaps between dies 1000, as shown in FIG. 5.

Figure 6:
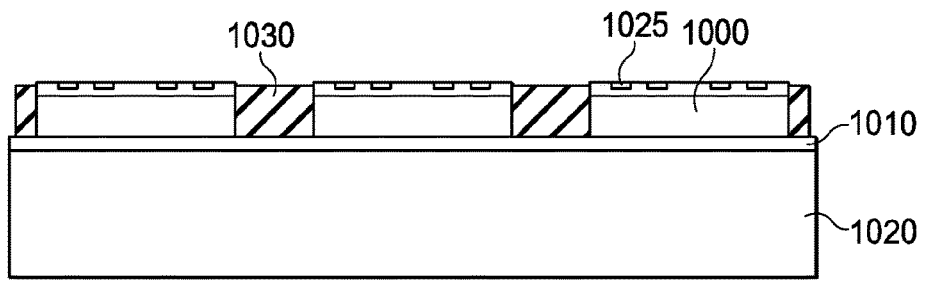

Referring back to FIG. 1, in step 140, a second portion of molding compound layer 1030 is removed to expose the top surface of dies 1000, as shown in FIG. 6. In embodiments of the present disclosure, an etching process may be performed to further remove a portion of molding compound layer 1030 such that the top surface of each die 1000 are uncovered and contact pads of each die 1000 are exposed, as shown in FIG. 6. In embodiments of the present disclosure, the etching process may be a single or a multiple step etching process. Further, the etching process may include wet etching, dry etching, or a combination thereof. The dry etching process may be an anisotropic etching process. The etching process may use reactive ion etch (RIE) and/or other suitable process. The RIE materials may be selected based on the materials of molding compound layer 1030. In one example, a dry etching process used to etch molding compound layer 1030 includes fluorine-containing gas such as CF4, SF6, or NF3.

In conventional die packaging methods, the top surface of each die may be covered with a carrier tape when dies are attached to DAF film. Then, molding compound layer is formed over the dies with the carrier tape. Then, a polishing process, using chemical mechanical polishing (CMP) process or a grinding process, for example, is performed to remove the molding compound layer deposited over dies such that the top surface of the dies will be uncovered (i.e. no longer covered by the molding compound layer). Accordingly, the top surface of molding compound layer and the top surface of dies are substantially the same. During the CMP process, the carrier tapes on the top surface of dies are used as a polishing stop indication. In embodiments of the present disclosure, a pad used in the CMP process includes a detecting device for detecting the change(s) of the materials being polished. For example, the detecting device is capable of detecting the density of the materials being polished. Accordingly, when the molding compounds are removed and the carrier tapes on the top surface of the dies are exposed to the pad during the CMP process, the detecting device will be able to detect the differences of the density between the molding compound material and the carrier tapes. Upon the detection of the carrier tapes on the top surface of dies, the CMP process will stop so that the carrier tapes will act like a polishing stop indication. In addition, the carrier tapes also function as protective layers to protect the dies from being damaged by the CMP process. After the CMP process, the carrier tapes attached on the top surface of the dies are removed such that contact pads of dies are exposed.

Referring to FIGS. 2 through 6, in embodiments of the present disclosure, the top surface of each die 1000 may not be covered with the carrier tape when dies 1000 are singulated from the substrate and then attached to DAF film 1010 of carrier wafer 1020. Accordingly, when molding compound layer 1030 is formed over carrier wafer 1020, dies 1000 being covered by molding compound layer 1030 may not include carrier tape to protect the top surface of dies 1000. In embodiments of the present disclosure, the removing of molding compound layer 1030 is performed by two steps, as shown in FIGS. 5 and 6. The first molding compound removal step may remove only a portion, but not all, of molding compound layer 1030 covering the top surface of dies 1000, as shown in FIG. 5. The first molding compound removal step may be performed by a grinding process or a CMP process. In the second molding compound removal step, the remaining portion of molding compound layer 1030 covering the top surface of dies 1000 may be removed to expose contact pads 1025 of dies 1000, as shown in FIG. 6. The second molding compound removal step may be performed by etching process. The etching process may be a single or a multiple step etching process. Further, the etching process may include wet etching, dry etching, or a combination thereof. The dry etching process may be an anisotropic etching process. The etching process may use reactive ion etch (RIE) and/or other suitable process. In one example, a dry etching process is used to etch the remaining portion of molding compound layer 1030. In furtherance of the example, the chemistry of the dry etch includes CF4, SF6, or NF3. Compared to the grinding or CMP process, the etching process may be more selective and specific such that only molding compound layer 1030 may be removed without damaging dies 1000. Accordingly, tape carriers for protecting the top surface of dies 1000 may not be needed in embodiments of the present disclosure.

Figure 7:
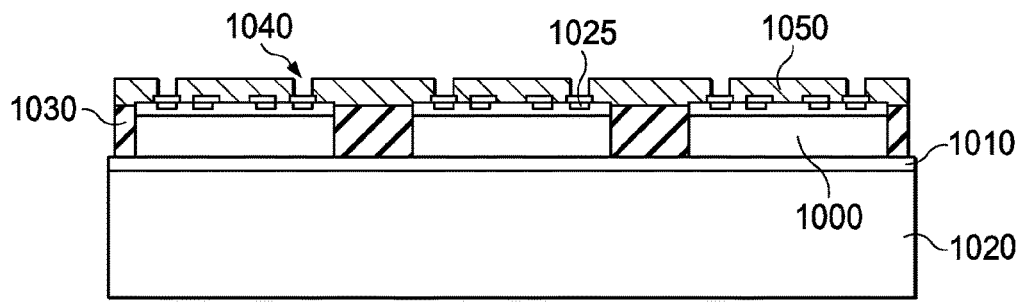

Referring back to FIG. 1, in step 150, a passivation layer (not shown) is formed over dies 1000 and molding compound layer 1030. In embodiments of the present disclosure, the passivation layer may be formed over dies 1000 on the top surface and on top of contact pads 1025 for structural support and physical isolation. The passivation layer may be made with silicon nitride (SiN), silicon dioxide (SiO2), silicon oxynitride (SiON), polyimide (PI), benzocyclobutene (BCB), polybenzoxazole (PBO), or other insulating material. An opening 1040 of the passivation layer may be made by removing a portion of the passivation layer using a mask-defined photoresist etching process to expose opening 1040. The size, shape, and location of openings 1040 are only for illustration purposes and are not limiting. It is advantageous to expose contact pads 1025 of dies 1000 within openings 1040, as shown in FIG. 7.

Referring back to FIG. 1, in step 160, a RDL layer 1050 is formed over the passivation layer (not shown) and contact pads 1025. As shown in FIG. 7, RDL layer 1050 may be deposited over the passivation layer and contact pads 1025. RDL layer 1050 may be deposited following the contour of the passivation layer. In embodiments of the present disclosure, RDL layer 1050 may be made with, e.g., Al, Ni, nickel vanadium (NiV), Cu, or a Cu alloy. In other embodiments of the present disclosure, RDL layer 1050 may be made by an electrolytic plating or electroless plating process. In the embodiment illustrated in FIG. 7, RDL layer 1050 may be made with Cu. In addition, in embodiments of the present disclosure, RDL layer 1050 may be made with a single layer, or multiple layers using an adhesion layer of Ti, TiW, or Cr, for example. Each die 1000 may be connected to a number of RDL layers 1050 to form a network of interconnections which may electrically connect to contact pad(s) 1025 of dies 1000 according to the function of the semiconductor devices formed in each die 1000.

Figure 8:
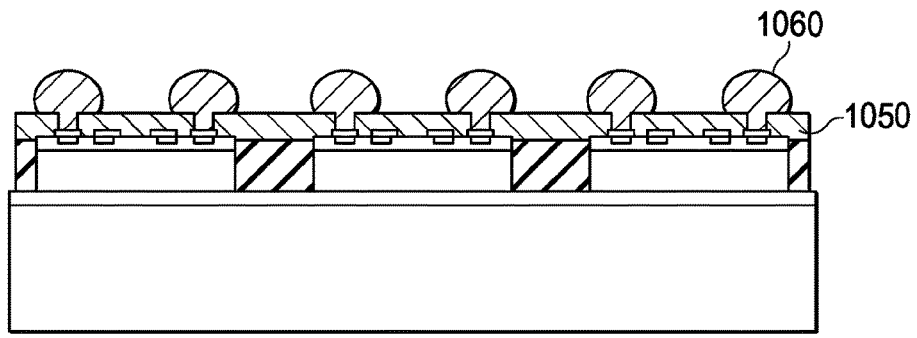
Figure 9:
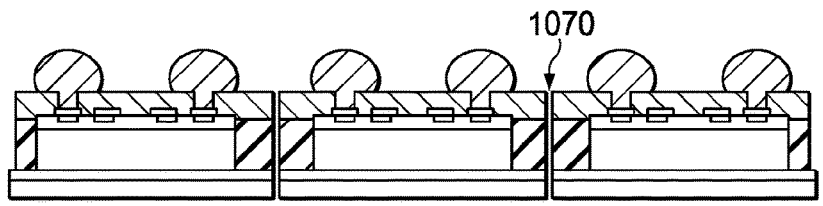

Referring back to FIG. 1, in step 170, solder balls 1060 may be mounted on the top surface of RDL layer 1050 close to at least one stacking via, as illustrated in FIG. 8. In embodiments of the present disclosure, solder balls 1060 may be any metal or electrically conductive material, e.g., Sn, lead (Pb), Ni, Au, Ag, Cu, bismuthinite (Bi) and alloys thereof, or mixtures of other electrically conductive material. In embodiments of the present disclosure, dies 1000 may comprise a plurality of contact pads 1025, as shown in FIG. 7, connected to a plurality of solder ball/bumps 120 through a network of RDL layers 1050 according to the functional design of semiconductor devices in each die 1000. The electrical signals from dies 1000 are routed through the network of RDL layers 1050 to one or more of the solder balls 1060 according to the function of the semiconductor devices in each die 1000.

Figure 10:
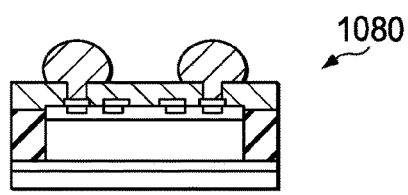

Referring to FIG. 1, in step 180, dies 1000 are singulated as separate packaged dies 1080, as shown in FIG. 10. Dies 1000 may be separated along singulation lines 1070 to form individual packaged dies 1080 in embodiments of the present disclosure.

In some embodiment, a method of packaging semiconductor dies includes attaching a die to a carrier wafer, the die having conductive contact pads on an upper surface thereof, forming a molding compound layer over the upper surface of the die, and recessing an upper surface of the molding compound layer using a first process, where the recessing removes a first portion of the molding compound layer disposed over the conductive contact pads. The method further includes removing a second portion of the molding compound layer using a second process different from the first process, where the conductive contact pads are exposed by the second process, and forming a redistribution layer (RDL) over the upper surface of the die.

In some embodiments, a method of packaging semiconductor dies includes attaching a first die to a first side of a carrier wafer, forming a molding compound over the first side of the carrier wafer and over the first die, the molding compound covering contact pads on an upper surface of the first die distal the carrier wafer, and performing a first process to remove an upper layer of the molding compound, where after performing the first process, a upper surface of the molding compound extends further away from the carrier wafer than the contact pads. The method further includes performing a second process different from the first process to remove a middle layer of the molding compound, where the second process exposes the contact pads, where a bottom layer of the molding compound remains over the carrier wafer after the second process, the bottom layer of the molding compound surrounding the first die, and forming a redistribution layer (RDL) over the first die and over the bottom layer of the molding compound.

In some embodiments, a semiconductor package includes a die attached to a film, the die having contact pads on a first side of the die facing away from the film, and a molding material over the film and around the die, an upper surface of the molding material distal the film being in a different plane from the first side of the die, where there is a step change between the upper surface of the molding material and the first side of the die. The semiconductor package further includes a redistribution layer (RDL) over the molding material and the die, the RDL being electrically coupled to the contact pads of the die, and external connectors directly coupled to the RDL.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods, and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of packaging semiconductor dies, the method comprising:
   attaching a die to a carrier wafer, the die having conductive contact pads on an upper surface thereof;
   forming a molding compound layer over the upper surface of the die;
   removing an upper portion of the molding compound layer disposed over the conductive contact pads using a first process;
   removing a middle portion of the molding compound layer using a second process different from the first process, wherein there is no intervening process to remove the molding compound layer between the first process and the second process, wherein removing the middle portion of the molding compound layer exposes the upper surface of the die, and wherein after removing the middle portion of the molding compound layer, an uppermost surface of a remaining bottom portion of the molding compound layer facing away from the carrier wafer is closer to the carrier wafer than the upper surface of the die, the remaining bottom portion of the molding compound layer surrounding the die; and forming a redistribution layer (RDL) over the upper surface of the die.

2. The method of claim 1, wherein attaching the die to the carrier wafer comprises attaching the die to the carrier wafer using a die attaching film (DAF).

3. The method of claim 1, wherein the first process comprises a grinding process or a chemical mechanical polishing (CMP) process.

4. The method of claim 1, wherein after the first process, an upper surface of the molding compound layer extends further away from the carrier wafer than the conductive contact pads of the die.

5. The method of claim 1, wherein the second process comprises an etching process.

6. The method of claim 5, wherein the etching process is a multiple step etching process.

7. The method of claim 5, wherein the etching process is a wet etching process.

8. The method of claim 5, wherein the etching process is a dry etch process.

9. The method of claim 1, further comprising forming a passivation layer between the RDL and the die.

10. The method of claim 1, further comprising:
forming openings in the RDL, wherein the openings are aligned with respective conductive contact pads of the die; and
forming external connectors over the opening, wherein the external connectors are electrically coupled to the conductive contact pads of the die.

11. A method of packaging semiconductor dies, the method comprising:
attaching a first die to a first side of a carrier wafer;
forming a molding compound over the first side of the carrier wafer and over the first die, the molding compound covering contact pads on an upper surface of the first die distal from the carrier wafer;
performing a first process to remove an upper layer of the molding compound, wherein after performing the first process, an upper surface of the molding compound extends further away from the carrier wafer than the contact pads;
performing a second process different from the first process to remove a middle layer of the molding compound, wherein the second process exposes the contact pads and recesses an uppermost surface of the molding compound distal from the carrier wafer below the upper surface of the first die, wherein a bottom layer of the molding compound remains over the carrier wafer after the second process, the bottom layer of the molding compound surrounding the first die; and
forming a redistribution layer (RDL) over the first die and over the bottom layer of the molding compound.

12. The method of claim 11, wherein performing the first process comprises performing a grinding process or a chemical mechanical polishing (CMP) process.

13. The method of claim 11, wherein performing the second process comprises performing an etching process.

14. The method of claim 13, wherein the etching process is performed using a gas comprising tetrafluoromethane (CF4), sulfur hexafluoride (SF6), or nitrogen trifluoride (NF3).

15. The method of claim 11, further comprising:
forming an opening in the RDL; and
forming a solder connector over the RDL, the solder connector extending into the opening and being electrically coupled to a conductive contact pad of the first die.

16. A semiconductor package comprising:
a die attached to a film, the die having contact pads at a first side of the die facing away from the film, wherein upper surfaces of the contact pads are level with the first side of the die;
a molding material over the film and around the die, the molding material having a first portion contacting a sidewall of the die, wherein an upper surface of the first portion of the molding material distal from the film is closer to the film than the upper surfaces of the contact pads;
a redistribution layer (RDL) over the molding material and the die, the RDL being electrically coupled to the contact pads of the die; and
an external connector directly coupled to the RDL.

17. The semiconductor package of claim 16, wherein the external connector comprises a solder material on an under bump metallurgy (UBM) layer, wherein the UBM layer contacts the RDL.

18. The semiconductor package of claim 16, further comprising a passivation layer between the RDL and the molding material.

19. The method of claim 1, wherein the second process is performed after the first process without an intervening process to remove the molding compound layer.

20. The method of claim 1, wherein the uppermost surface of the remaining bottom portion of the molding compound layer extends substantially parallel to an upper surface of the carrier wafer facing the die.

* * * * *